(12) United States Patent
Kashmiri et al.

(10) Patent No.: US 11,005,469 B1
(45) Date of Patent: May 11, 2021

(54) TWO STEP HIGH SPEED AUTO-ZERO AND SELF-CALIBRATION COMPARATOR

(71) Applicant: Robert Bosch GmbH, Stuttgart (DE)

(72) Inventors: Sayyed Mahdi Kashmiri, Sunnyvale, CA (US); Rainer Blechschmidt, Creglingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/698,626

(22) Filed: Nov. 27, 2019

(51) Int. Cl.
  H03K 5/22 (2006.01)
  H03K 5/24 (2006.01)

(52) U.S. Cl.
  CPC .................................... H03K 5/24 (2013.01)

(58) Field of Classification Search
  CPC ........................................................ H03K 5/24
  USPC ........................................................... 327/64
  See application file for complete search history.

(56) References Cited

U.S. PATENT DOCUMENTS

| | | | | |
|---|---|---|---|---|
| 5,990,814 | A * | 11/1999 | Croman | H03K 5/2481 341/118 |
| 6,429,697 | B1 * | 8/2002 | Amazeen | H03F 3/45183 327/362 |
| 2008/0018392 | A1 * | 1/2008 | Nolan | H03F 3/45986 330/9 |

OTHER PUBLICATIONS

Miyahara et al., "A Low-Noise Self-Calibrating Dynamic Comparator for High-Speed ADCs", Department of Physical Electronics, 2008, Japan, 4 pages.
Ramkaj, et al., "An 11 GHz Dual-Sided Self-Calibrating Dynamic Comparator in 28nm CMOS" Electronics Journal, Dec. 21, 2018, Belgium, 12 pages.
Enz et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, 31 pages.
Pelgrom et al., "Matching Properties of MOS Transistors", IEEE Journal of Solid-State Circuits, vol. 24, No. 5, Oct. 1989, 8 pages.
J. H. Huijsing, "Operational Amplifiers—Theory and Design," Springer, 3rd Edition, 2017, 25 pages.
H. Jeon, et al., "Offset voltage analysis of dynamic latched comparator," IEEE MWSCAS, Aug. 2011, 4 pages.

* cited by examiner

Primary Examiner — Metasebia T Retebo
(74) Attorney, Agent, or Firm — Brooks Kushman P.C.

(57) ABSTRACT

A method of controlling a comparator includes during a first time period, enabling an auto-zero loop to provide an initial offset calibration of a differential preamplifier that includes differential memory capacitors; and during a second time period after the first window, enabling a self-calibrating circuit to provide an offset calibration of the differential preamplifier, and minimizing an output offset of a dynamic latch. Wherein the dynamic latch is configured to latch an output of the differential preamplifier at a sampling frequency, the auto-zero loop including an auxiliary amplifier configured to inject a correction signal into the differential preamplifier based on a voltage across the differential memory capacitors, and the self-calibrating circuit including a charge pump configured to adjust the voltage across the differential memory capacitors based on an output of the dynamic latch.

15 Claims, 12 Drawing Sheets

TWO STEP HIGH SPEED AUTO-ZERO AND SELF-CALIBRATION COMPARATOR

TECHNICAL FIELD

This invention relates generally to a circuit and method of auto-zeroing and self-calibrating a comparator.

BACKGROUND

Analog voltage or current comparators are widely used building blocks in electronic circuits that have an input stage, which is optimized for low-offset operation. For example, the comparator is the basic analog-to-digital interface element for wireless and very-large-scale integration (VLSI) systems, analog/mixed ICs and analog-to-digital converters (ADC's).

A comparator can be a device, which compares a signal voltage (VIN) on one input with a reference voltage (ground) on its other input that generates a digital output being logic 1 or 0 when one of the signal levels is greater than the other. The comparator's external pins include a differential pair having a non-inverting input (+), an inverting input (−), and the comparator generally also includes an output pin.

SUMMARY

A comparator circuit includes a differential preamplifier, a dynamic latch, an auto-zero loop, a self-calibrating circuit, and control logic. The differential preamplifier including differential memory capacitors. The dynamic latch configured to latch an output of the differential preamplifier at a sampling frequency. The auto-zero loop including an auxiliary amplifier configured to inject a correction signal into the differential preamplifier based on a voltage across the differential memory capacitors. The self-calibrating circuit including a charge pump configured to adjust the voltage across the differential memory capacitors based on an output of the dynamic latch. The control logic may be configured to, during a first time period, send a first signal to enable the auto-zero loop to provide an initial offset calibration of the differential preamplifier, and during a second time period occurring after the first time period, send a second signal to enable the self-calibrating circuit to provide an offset calibration of the differential preamplifier, minimize an offset of the dynamic latch.

A method of controlling a comparator includes during a first time period, enabling an auto-zero loop to provide an initial offset calibration of a differential preamplifier that includes differential memory capacitors; and during a second time period after the first window, enabling a self-calibrating circuit to provide an offset calibration of the differential preamplifier, and minimizing an output offset of a dynamic latch.

A comparator circuit includes a differential preamplifier, a dynamic latch, an auto-zero loop, a self-calibrating circuit, and control logic. The differential preamplifier including differential memory capacitors. The dynamic latch configured to latch an output of the differential preamplifier at a sampling frequency. The auto-zero loop including an auxiliary amplifier configured to inject a correction signal into the differential preamplifier based on a voltage across the differential memory capacitors. The self-calibrating circuit including a charge pump configured to adjust a current to the differential memory capacitors based on an output of the dynamic latch. The control logic may be configured to, during a first time period, send a first signal to enable the auto-zero loop to provide an initial offset calibration of the differential preamplifier, and during a second time period occurring after the first time period, send a second signal to enable the self-calibrating circuit to provide an offset calibration of the differential preamplifier, minimize an offset of the dynamic latch.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

Applications such as automotive Lidar (Light ranging and detection) require electronic circuitry that operate at both high-speed and high-precision. This is related to the receive signal dynamic range and modulation speeds used for transmission. Such systems form a transceiver in which detection capability relies on high fidelity electronics. Techniques such as phase-coding in an intensity modulated laser transmission burst improve the overall system performance but impose contradictive requirements on the electronic circuits in regards to the need to combine low offset and high speed operation, e.g. to prevent loss of information. As a result, the receive signal path of such system might require effective input referred offset levels below the noise level. Electronics for instrumentation applications benefit from lower-bandwidths, which allows trade-offs to improve accuracy, mainly due to the mismatch of components such as transistors. Such trade-offs allow the matching to be improved by increasing device sizes. Further improvements can be achieved by dynamic error correction techniques such as auto-zeroing. For high-speed applications, the device sizes have to be optimized for speed in order to minimize parasitic capacitances, however this results in poor offset performance. Conventional auto-zeroing schemes also can result in potentially high residual offsets due to the effect of offset caused by the high speed dynamic latches used at the comparator output stage, not being treated by the auto zero loop. Comparator offset can also be calibrated, however, a factory calibration is not robust enough to guarantee lifetime performance of the circuits in automotive conditions. This implies that self-calibrating techniques beyond the conventional auto-zeroing and calibration should be sought.

Figure 1B:
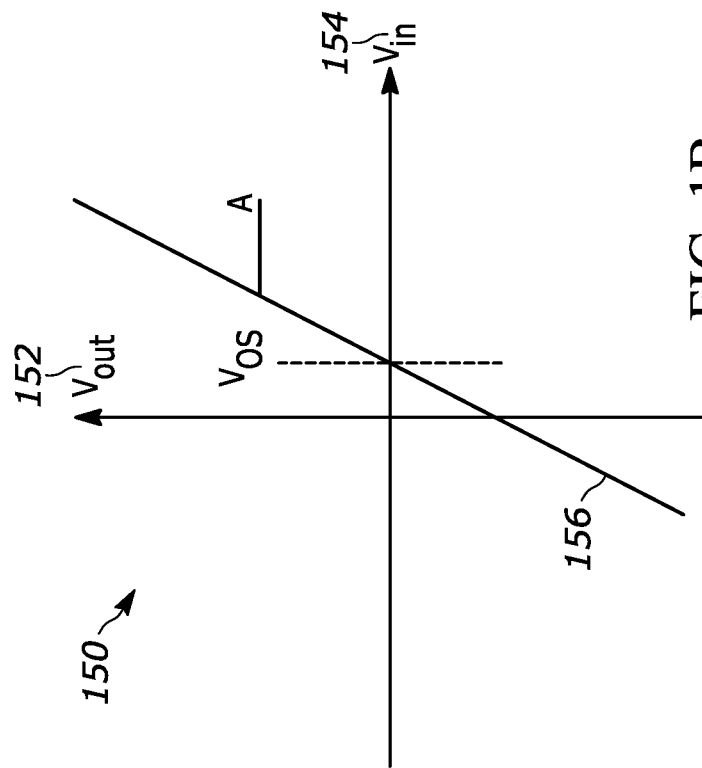
FIG. 1B is a graphical representation of the relationship of input voltage to output voltage of the amplifier of FIG. 1A.
Figure 1A:
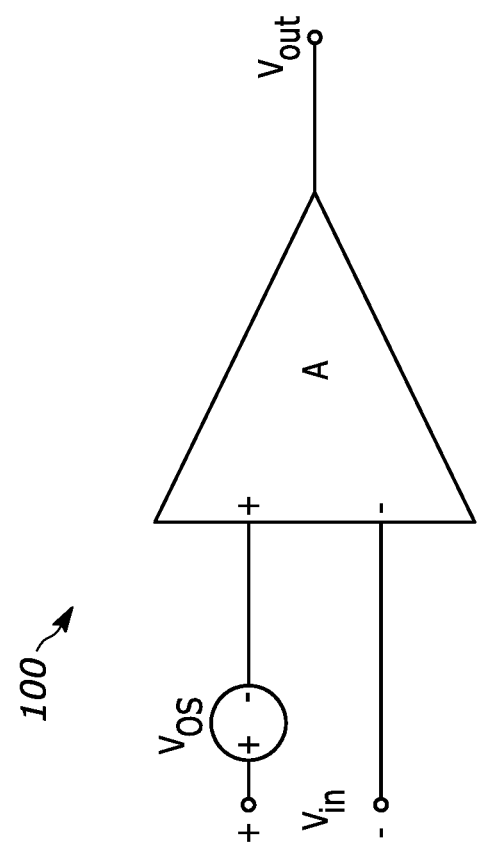
FIG. 1A is a block diagram of an amplifier with an offset.
Figure 2B:
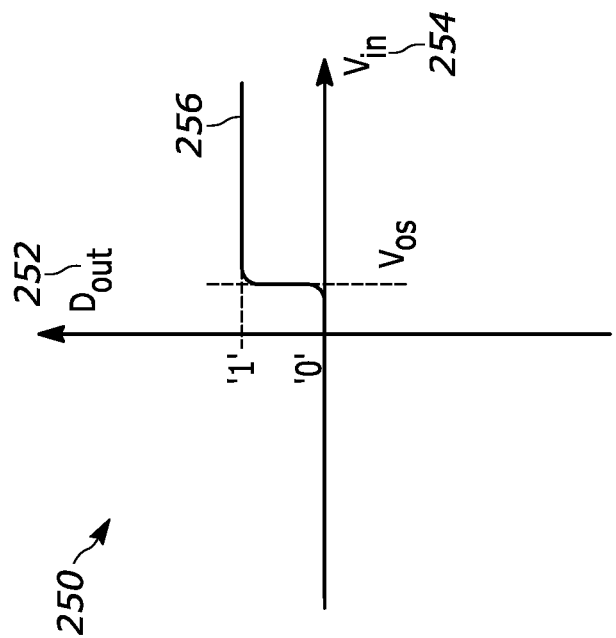
FIG. 2B is a graphical representation of the relationship of input voltage to output voltage of the comparator of FIG. 2A.
Figure 2A:
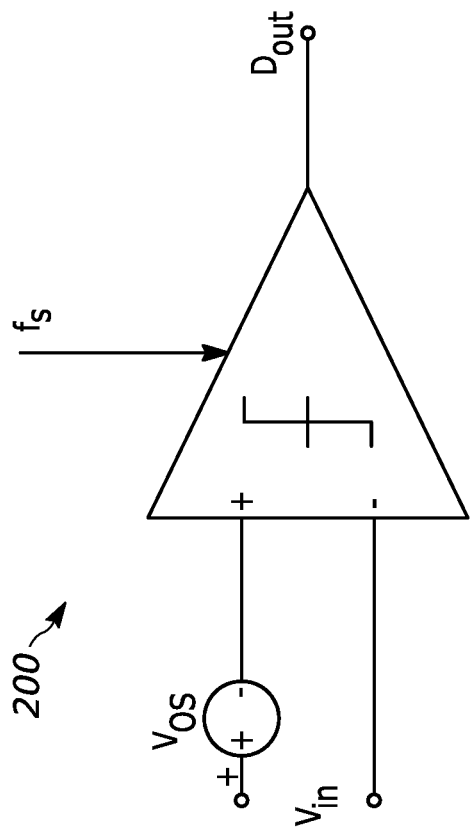
FIG. 2A is a block diagram of a comparator with an offset.

A practical implementation of an amplifier or comparator will have an effective input offset voltage due to multiple non-ideal effects such as electronic component mismatch. FIG. 1A is a block diagram of an amplifier with an offset 100. The input referred offset of an amplifier ($V_{OS}$) can be modelled with a DC voltage source in series with its input. FIG. 1B is a graphical representation of the relationship 150 of input voltage 154 to output voltage 152 of the amplifier 100. With zero input signal, this voltage is required at the input to create a zero output voltage. As a result of this, the amplifier's input-output characteristic does not cross zero. The same concept can be applied to a comparator, in which the comparator, to be able to accurately distinguish the polarity of the input signal, includes a net input referred DC voltage ($V_{OS}$) that is placed in series with its input. FIG. 2A is a block diagram of a comparator with an offset 200. FIG. 2B is a graphical representation of the relationship 250 of input voltage 254 to output voltage 252 of the comparator 200.

Thus, offset reduction techniques such as chopping, auto-zeroing, correlated-double sampling, trimming and calibration methods, etc. have been extensively used in integrated circuits. Each method has benefits and drawbacks and each has its best fit to certain applications. These could involve considerations regarding: continuous operation, introduction of disturbances and glitches, robustness over temperature and lifetime, etc. which may be important to the specific application.

Figure 3:
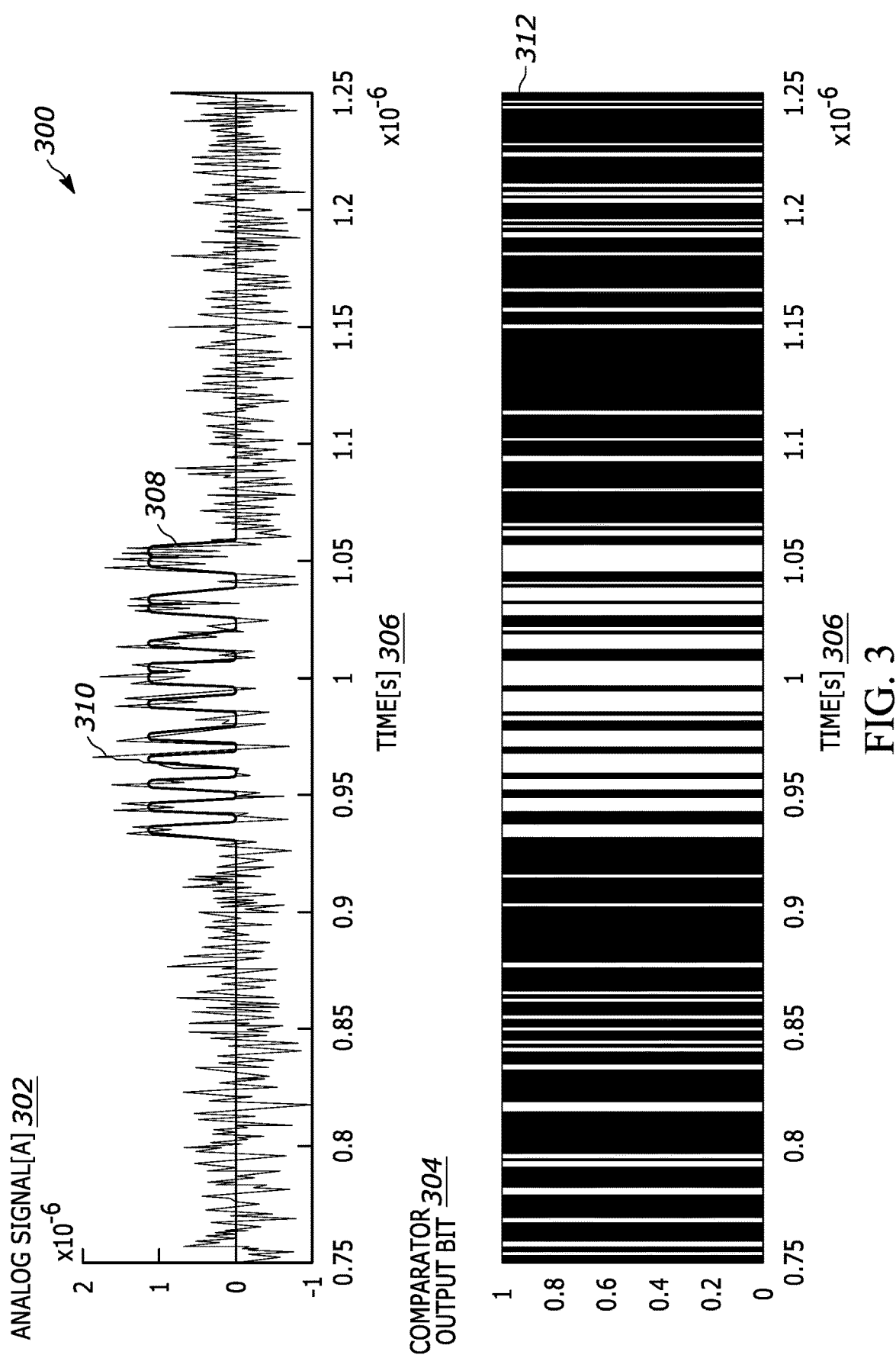
FIG. 3 is a graphical representation of an analog input signal with no offset and the resultant comparator output with respect to time.
Figure 4:
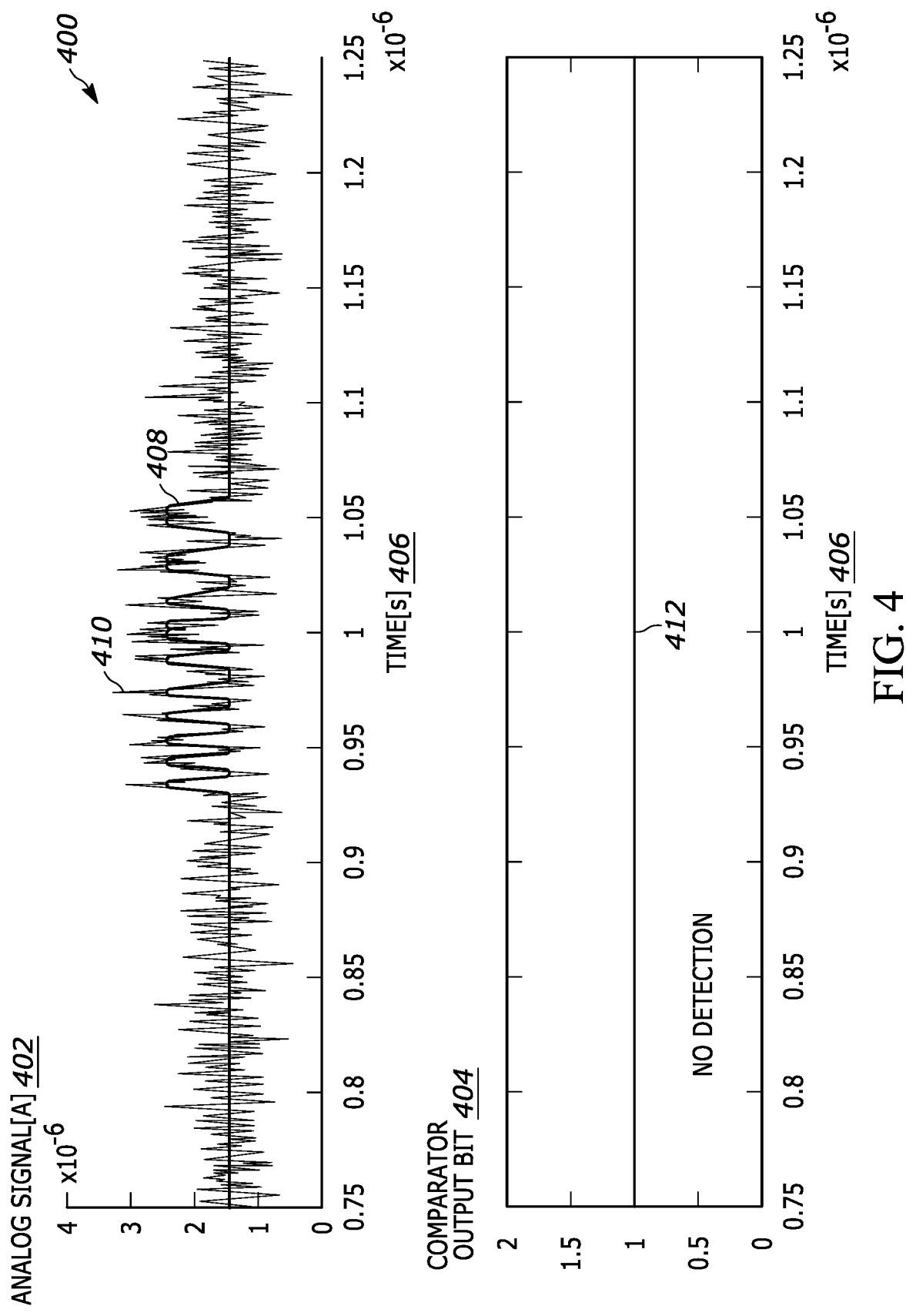
FIG. 4 is a graphical representation of an analog input signal with an offset and the resultant comparator output with respect to time.

Intensity modulated phase coded Lidar is one example of a system in which a comparator offset can severely affect performance. In this case, time-of-flight is detected by correlating the output bit-stream of a comparator with the transmitted phase pattern. FIG. 3 is a graphical representation 300 of an analog input signal 302 with no offset and the resultant comparator output 304 with respect to time 306. The analog input signal 302 includes the intended digital signal 308 and the actual analog signal 310 as received. FIG. 4 is a graphical representation 400 of an analog input signal 402 with an offset and the resultant comparator output 404 with respect to time 406. The analog input signal 402 includes the intended digital signal 408 and the actual analog signal 410 as received.

The two hypothetical cases illustrated, one with low offset (FIG. 3) and a second where the input referred offset is larger than the noise (FIG. 4). The first case (FIG. 3) illustrates the output of a low offset comparator given a noisy input. In this case the signal can be recovered even in the presence of noise. In the second case (FIG. 4), the offset is greater than noise such that signal detection is disrupted. These examples illustrate that control of offset is key to ensuring system performance.

For the case of comparators, in which a sampled (synchronous) and wideband operation are of concern, auto-zeroing may be used to offset reduction techniques. Auto-zeroing is a process in which a comparator's pre-amplifier is disconnected from the signal path, its inputs are shorted in order to allow its offset to develop a DC voltage at its output, then this DC voltage is sensed and used to inject a correction signal, usually a current, back into the amplifier in order to null the offset. This is done in a closed loop form and hence the residual offset is reduced by the loop gain. The auto-zero loop is opened once settled to the correction signal level and the pre-amplifier is available for normal operation. During the normal operation the correction signal is being produced by the correction path as the value to produce it remains stored on capacitors. The storage could happen both at the out or input of the pre-amplifier.

Figure 5:
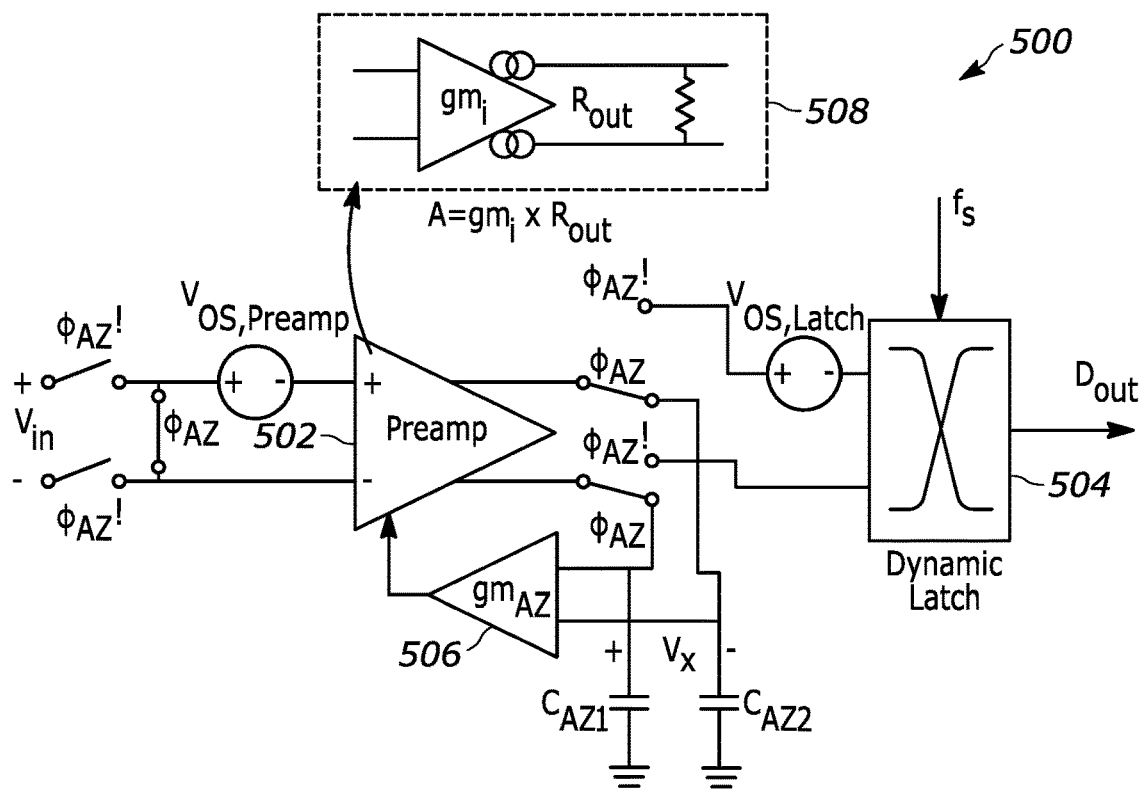
FIG. 5 is a schematic diagram of a comparator with an auto-zeroing circuit.
Figure 6:
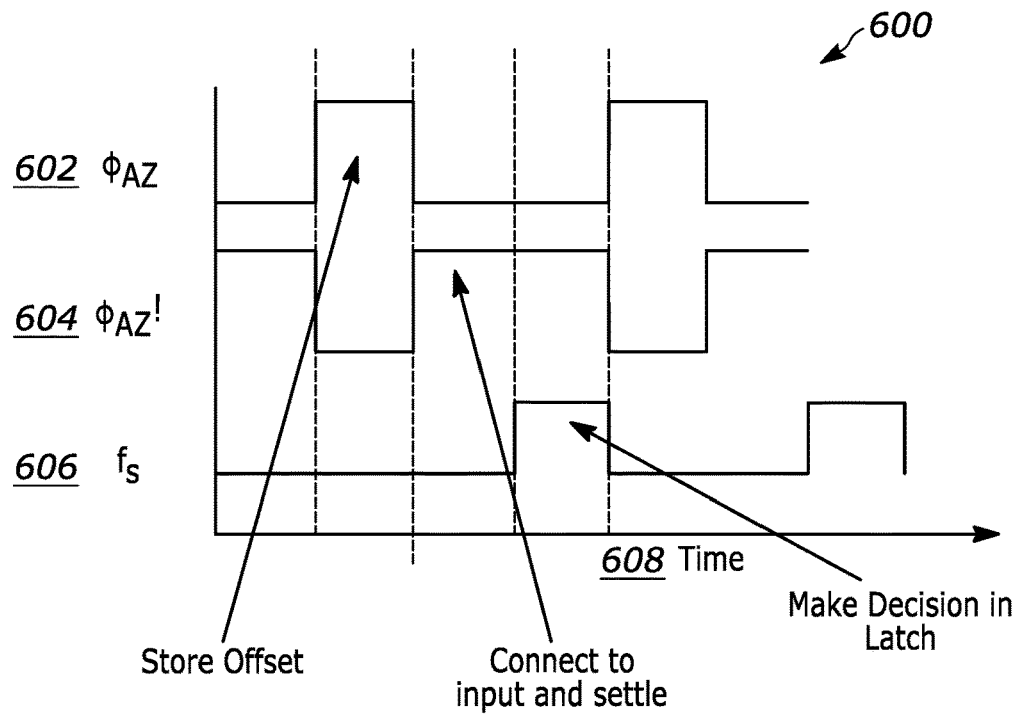
FIG. 6 is a graphical illustration of phase and clocking signals, of the circuit shown in FIG. 5, with respect to time.

FIG. 5 is a schematic diagram of an auto-zeroing comparator 500. The comparator 500 includes a preamplifier 502, a dynamic latch 504, and a feedback loop 506. This may be represented as the amplifier equivalent circuit 508. FIG. 6 is a graphical illustration 600 of phase 602, 604, and clocking signals 606, of the auto-zeroing comparator 500, with respect to time 608.

A comparator is made of a preamplifier with a limited gain (A) such that A=5× to 20×. The pre-amplifier drives a dynamic latch, that adjusts connections in response to the operation (FIG. 5). The preamplifier and the effective latch input referred offsets are denoted by $V_{OS,Preamp}$ and $V_{OS,Latch}$, respectively. Without the application of any offset reduction techniques the effective input referred offset of the comparator will be:

$$V_{OS,Comp} = \sqrt{V_{OS,Preamp}^2 + \frac{V_{OS,Latch}^2}{A^2}} \tag{1}$$

In most cases, since the dominant source of offset is $V_{OS,Preamp}$, the pre-amplifier's offset is auto-zeroed. This may be accomplished by shorting its inputs during phase $\phi_{AZ}$ (when signal path is disconnected) and storing its output on storage capacitors ($C_{AZ1}$ and $C_{AZ2}$). In the meanwhile, the voltage ($V_X$) across the capacitors ($C_{AZ1}$ and $C_{AZ2}$) drives an auxiliary amplifier, such as a transconductor ($gm_{AZ}$), which then injects a correction signal such as a current into the main amplifier. This then drives its output into a theoretical level of zero. Assuming an offset free $gm_{AZ}$ and assuming the preamplifier's transconductance to be $gm_i = gm_{AZ}$ for simplicity, then it can be shown that the initial offset of the preamplifier is reduced by the its gain: A. The total residual offset of the comparator then referred to the input may be expressed as in the equation below:

$$V_{OS,res} = \sqrt{\left(\frac{V_{OS,Preamp}}{gm_{AZ} \times \frac{A}{gm_i}}\right)^2 + \frac{V_{OS,Latch}^2}{A^2}} \sim \frac{1}{A} \times \sqrt{V_{OS,Preamp}^2 + V_{OS,Latch}^2} \quad (2)$$

Equation 3 illustrates that the auto-zeroing scheme does not suppress the latch effective offset. This is usually less of a problem in low-speed applications where the latch transistors can be sized properly for matching so as to reduce their initial offset. In high speed applications this is not practical due to the increase of parasitic capacitances and loss of speed.

Figure 8:
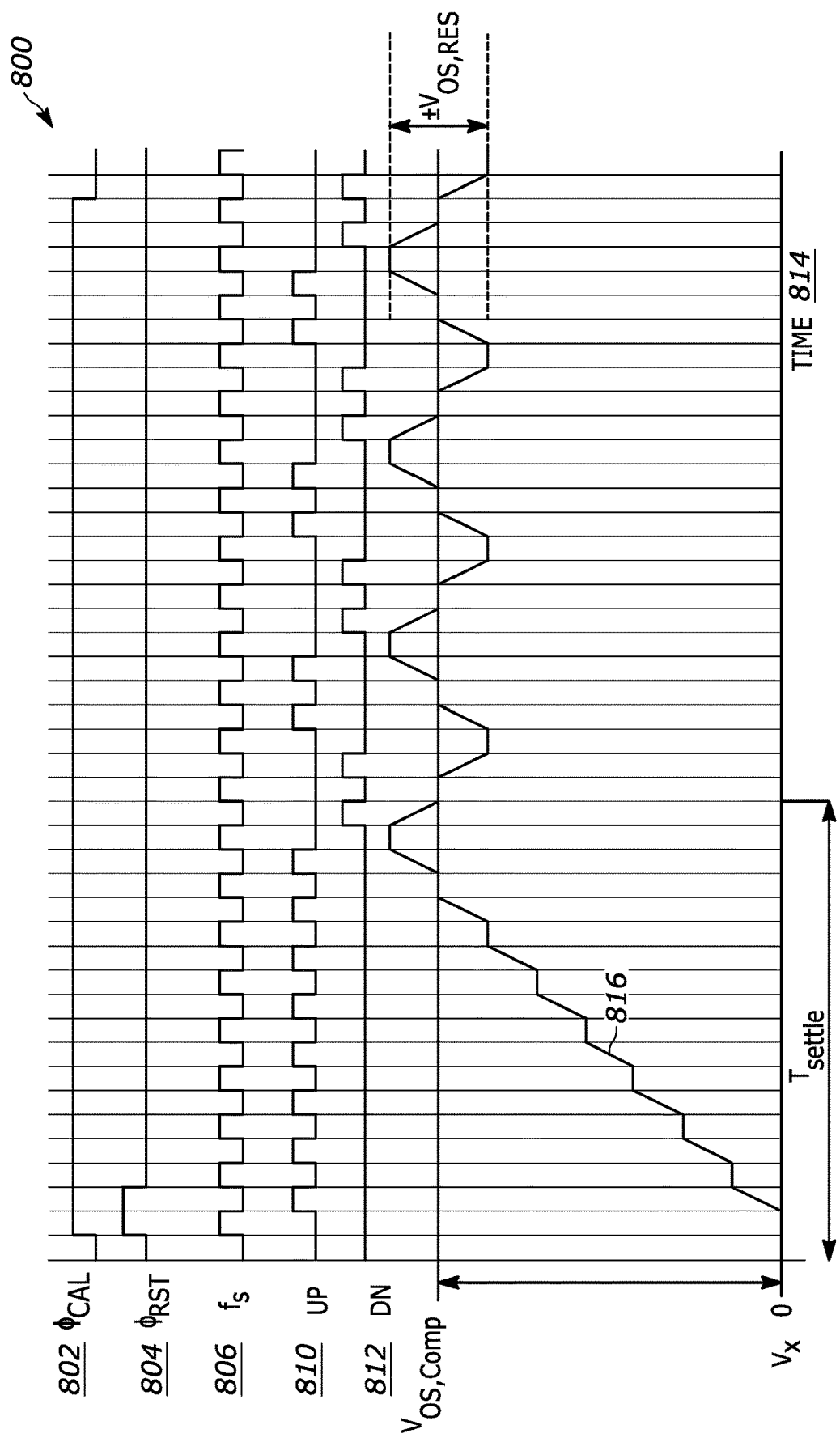
FIG. 8 is a graphical illustration of signals of the self-calibrating comparator using only a charge pump circuit of FIG. 7 with respect to time.
Figure 9:
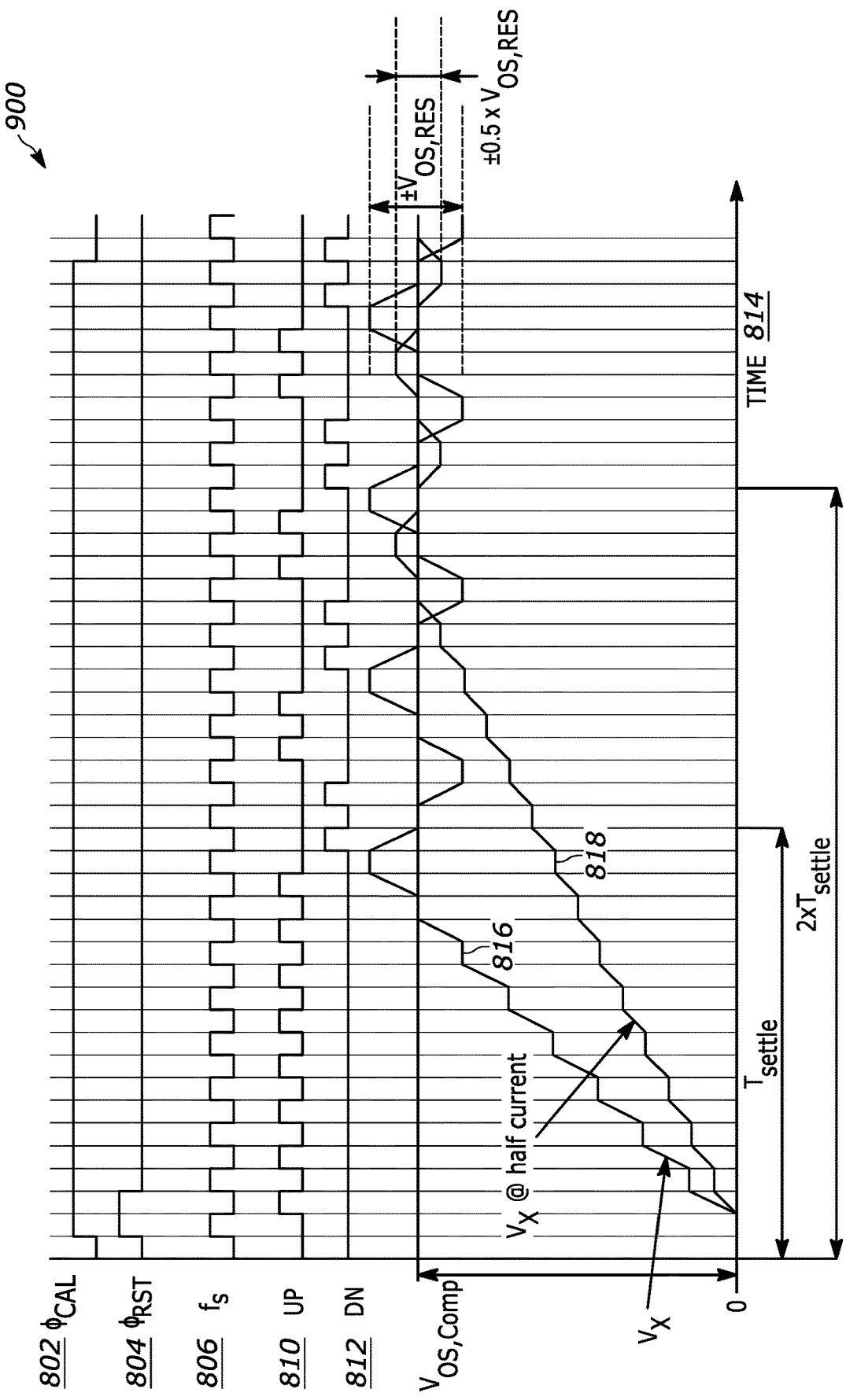
FIG. 9 is a graphical illustration of signals of the self-calibrating charge pump circuit of FIG. 7 employing a reduced residual offset with respect to time.

Comparators in high-speed ADCs systems may overcome this by introducing self-calibrating architectures around the complete comparator. In these schemes the complete comparator is placed into a feedback loop where an auxiliary input stage is set to inject a compensating current into the comparator's preamplifier. The voltage to drive this auxiliary pair is generated by means of a voltage generated by a charge pump injecting a current into a capacitor. The charge pump is driven by the comparator output bit through some logic gates. This scheme and its associated timing diagrams are shown in FIGS. 7, 8, and 9.

Figure 7:
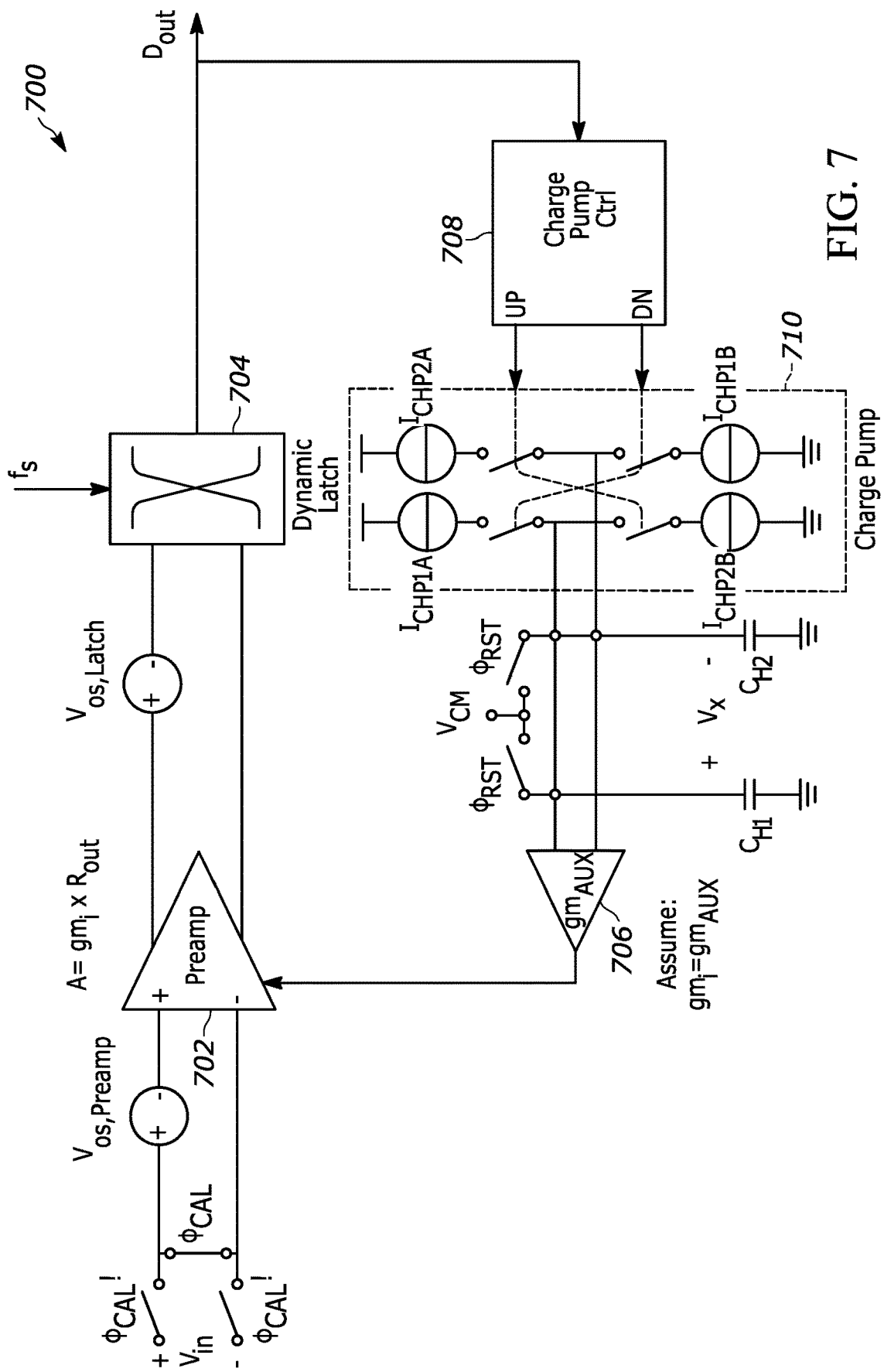
FIG. 7 is a schematic diagram of a self-calibrating comparator using only a charge pump circuit.

FIG. 7 is a schematic diagram of a self-calibrating charge pump circuit 700. The charge pump circuit 700 includes a preamplifier 702, a dynamic latch 704, a feedback amplifier 706, and a charge pump control circuit 708 to control a charge pump 710. FIG. 8 is a graphical illustration 800 of signals of the self-calibrating charge pump circuit 700 with respect to time 814. The signals include $\phi_{CAL}$ 802, $\phi_{RST}$ 804, $f_s$ 806, UP 810, DN 812, and the $D_{out}$ 816. FIG. 9 is a graphical illustration of signals of the self-calibrating charge pump circuit 700 employing a reduced residual offset with respect to time 814. The signals include $\phi_{CAL}$ 802, $\phi_{RST}$ 804, $f_s$ 806, UP 810, DN 812, $D_{out}$ 816, and $D_{out}$ (½ current) 818.

In principle, this architecture tends to create a relaxation oscillator around the clocked comparator, where the charge pump current, $I_{CHP}$, the memory capacitor $C_H$ and the comparator input referred offset together with the comparator sampling clock $f_s$ (with period $T_s$) determine its startup time and its oscillation amplitude. Upon the start of calibration phase, the auxiliary pair's input memory ($V_X$: the hold capacitor voltage) is reset. Due to the total input referred offset, the comparator is toggled to one side and hence the negative polarity of the loop designed through the charge pump injection polarity, drives a current into the hold capacitors in order to counteract the effect of offset. Through the auxiliary pair, this voltage creates a compensation current into the comparator that once it overcomes the offset the comparator output bit starts to toggle. The toggling output changes the polarity of the charge pump output current, which reverses the direction of the voltage on the hold capacitor. This continues until the comparator toggles again and the process repeats like a relaxation oscillator. This results in a ripple on the hold capacitor compensation voltage.

Assuming the transconductance of the auxiliary pair ($gm_{AUX}$) and the preamplifier's transconductance ($gm_i$) are the same and the comparator has no hysteresis, this ripple corresponds to the residual input referred offset of the comparator after calibration. Once calibration phase ends, the charge pump stops injecting and the memory of the hold capacitors maintains the required magnitude of the compensation current. The minimum residual offset that can be achieved with this scheme may be expressed as in equation 3:

$$V_{OS,res} = \pm \frac{T_S \times I_{CHP}}{C_H} \quad (3)$$

One limitation of this technique is that an initial time is required for the self-calibrating loop to reach the state of oscillation. This will be a function of the initial input referred offset $V_{OS,comp}$, charge pump current and the hold capacitor which may be expressed as in equation 4:

$$T_{settle} = \frac{C_H \times V_{OS,Comp}}{I_{CHP}} \quad (4)$$

Furthermore, the other drawback of the method is that for a fixed clock frequency (fixed by application), the only way to reduce this residual offset (see equation 3), for instance to levels smaller than the noise level, is by reducing the charge pump current ($I_{CHP}$) and/or increasing the hold capacitor $C_H$. The drawback of this approach as shown in FIG. 9 and predicted by equation (4) that is that the total initial settling time of the self-calibrating loop, when starting from reset, will be increased by the same improvement factor. This can have application level disadvantages in terms of limiting the system's effective conversion rate. A potential example of such case is the case of automotive Lidar mentioned earlier. In such applications a high conversion rate is desired as this is tied to the scan rate of the scanning system, which is linked to the overall Lidar frame-rate.

The self-calibrating technique has therefore good potential for being used for the case of precision high-speed comparators as it compensates for the offset of the dynamic latch in the comparator backend (in contrast to auto-zero only methods), however, an improvement is needed in order to enable the achievement of both fast settling and reduced residual offset.

This disclosure presents a two-step self-calibrating auto-zero method for high-speed comparators in order to achieve the very low residual offset levels while maintaining a relatively short calibration time. This system has application in general high-speed ADC's in which this method suits applications such as pulse coded dTOF automotive Lidar. Other potential applications include imager sensors with global shutter. Indirect time-of-flight 3D sensors and generally any data conversion system where high throughput and low offset need to be combined.

Figure 10:
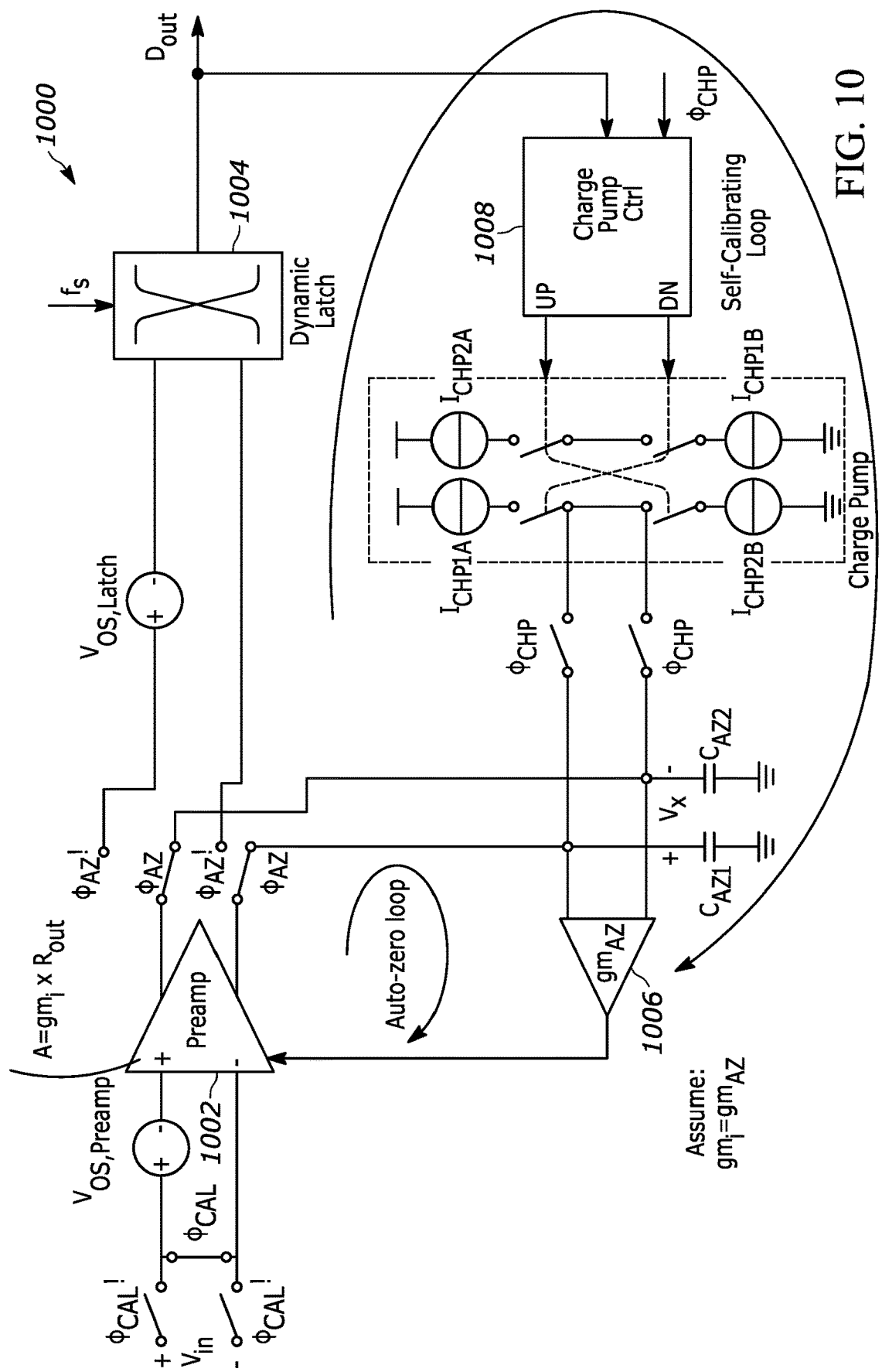
FIG. 10 is a schematic diagram of a two-step auto-zero self-calibrating comparator.
Figure 11A:
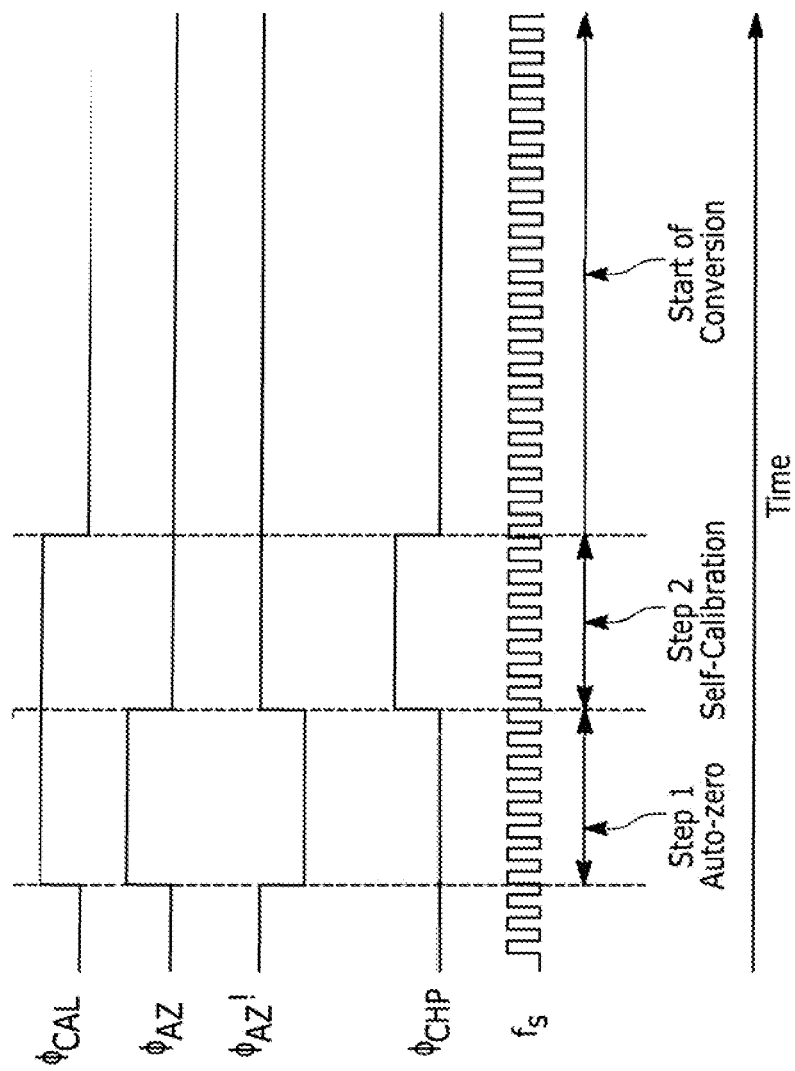
FIG. 11A is a graphical representation of phase and clock signals of the two-step auto-zero self-calibrating comparator of FIG. 10 with respect to time.
Figure 11B:
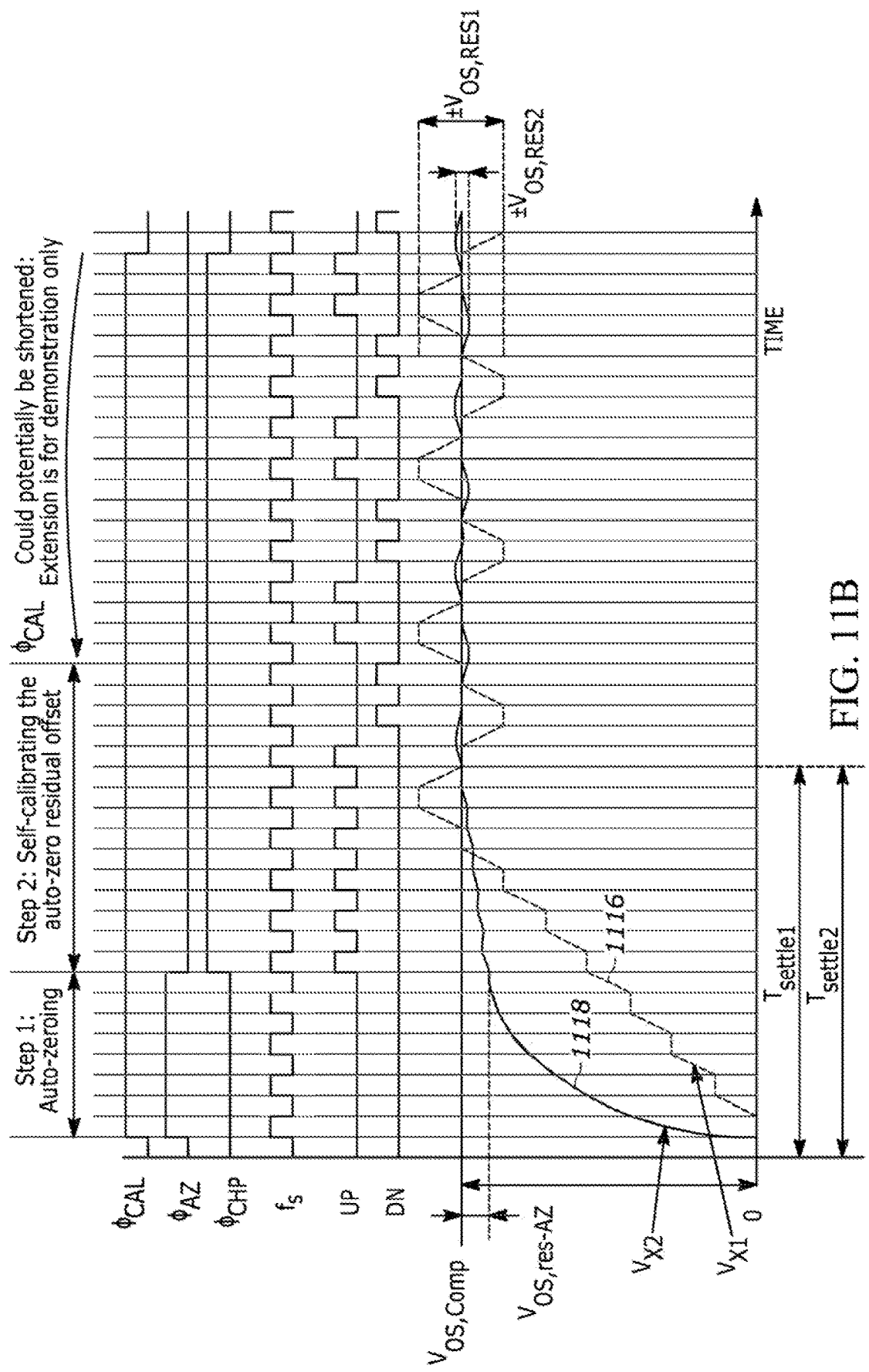
FIG. 11B is a graphical representation of signals of the two-step auto-zero self-calibrating comparator of FIG. 10 with respect to time.

The combination of the two methods in a two-step scheme in which one method continues as a second step calibration from where the first step ended. The arrangement around the comparator is illustrated in FIG. 10 and the timing diagrams are illustrated in FIGS. 11A and 11B. These figures provide an illustration for the case of a voltage domain comparator. The additional hardware to implement this is minimal.

The offset reduction technique proposed here applies a closed-loop auto-zero phase as a first step to the preamplifier of the comparator and stores an initial compensation voltage $V_X$ on the auto-zero capacitors $C_{AZ}$ at the end of this phase. Since the preamplifier is broadband, this step can be achieved relatively fast with the exponential settling behavior of the amplifier, which can be much faster than the linear settling achievable with a self-calibrating loop of FIG. 7, as may be expressed in equation 5:

$$T_{settle,step1} \propto N \times C_{AZ} \times \left(\frac{1}{gmi}\right) \quad (5)$$

Where N is the number of time-constants one considers for settling. Since a second calibration step will take care of the residual offset after the auto-zero there is the possibility of not having complete settling for the first step, which helps reducing the calibration time further.

At the end of the first step (the pre-amplifier auto-zero step), the input referred offset is equal to the residual offset predicted by equation (2) for an auto-zero comparator, which is considerably less than the non-calibrated comparator. Following this, a second step closed loop calibration based on the self-calibration scheme shown in FIG. 7 is applied to the auto-zeroed comparator. The second step aims at reducing the contributing term to the residual offset due to the offset of the dynamic latch.

One improvement is that the correction voltage already stored on the auto zeroing capacitors $C_{AZ}$ ($V_X$) is not reset at the beginning of the self-calibration phase. Rather than resetting $V_X$, this value is used as the initial condition for the second closed-loop operation. The rest of the scheme resembles that of FIG. 7, involving a charge pump (operated during phase $\phi_{CHP}$) and logic 1008 or 1208 to drive it from the comparator output. When due to the residual offset the comparator is stuck at a given output, the charge pump injects some extra correction current into the $C_{AZ}$ capacitors until it overcomes the residual offset and the output bit flips. This reverses the polarity of the charge pump resulting in toggling of the bit and this way the relaxation oscillation effect starts.

This improvement is that, rather than the loop starting from the initial un-calibrated comparator offset $V_{OS,comp}$ described by equation (1), the loop starts from the residual offset $V_{OS,res}$ after the auto-zero phase that is described by equation (2). Neglecting the effect of the latch offset referred to the input, this residual offset can be approximated to have been reduced by the gain factor of the pre-amplifier A, significantly reducing the initial settling time.

As a result of this, when the second step, self-calibrating scheme starts, the extra compensation that it needs to apply is no longer to compensate for the full comparator offset, but rather only the effect of the dynamic latch offset. Since this is smaller, the second step's settling time will be much shorter for the same conditions (for hold capacitors and charge pump current) as prior art. This allows making a trade-off by extending the second phase's settling time in trade off for reduced residual offset. This can be done for example by choosing smaller charge pump current. This way, the residual offset can be effectively reduced to values below the noise level but not at the cost of additional settling time. The timing diagram in FIG. 11B compares such trade-off with prior art.

The tradeoff can also be made otherwise, i.e. by choosing to have larger residual offset (if tolerated by the application) and then achieving a lower calibration time. This can be valuable when the system conversion rate has to be increased further.

It should be noted that the two-step offset compensation method proposed in FIG. 10 is not limited only to the voltage-domain comparator architecture 1000 shown here but can also be expanded to current-domain comparators where the pre-amplifier 1002 (or 1202 of FIG. 12) is replaced with a current-in and current-out amplifier stage, injecting a current signal into a dynamic latch. In such an architecture the output current of the compensating auto-zero transconductor 1006 (or 1206 of FIG. 12) can still be injected into the current-domain preamplifier. This configuration is shown in FIG. 8. As can be seen, slight modification is required for the input switches as for a current-domain signal path, for the auto-zeroing (and calibration) to be done with no input signal, it means the inputs should be disconnected, rather than creating a short circuit like a voltage domain comparator.

Figure 12:
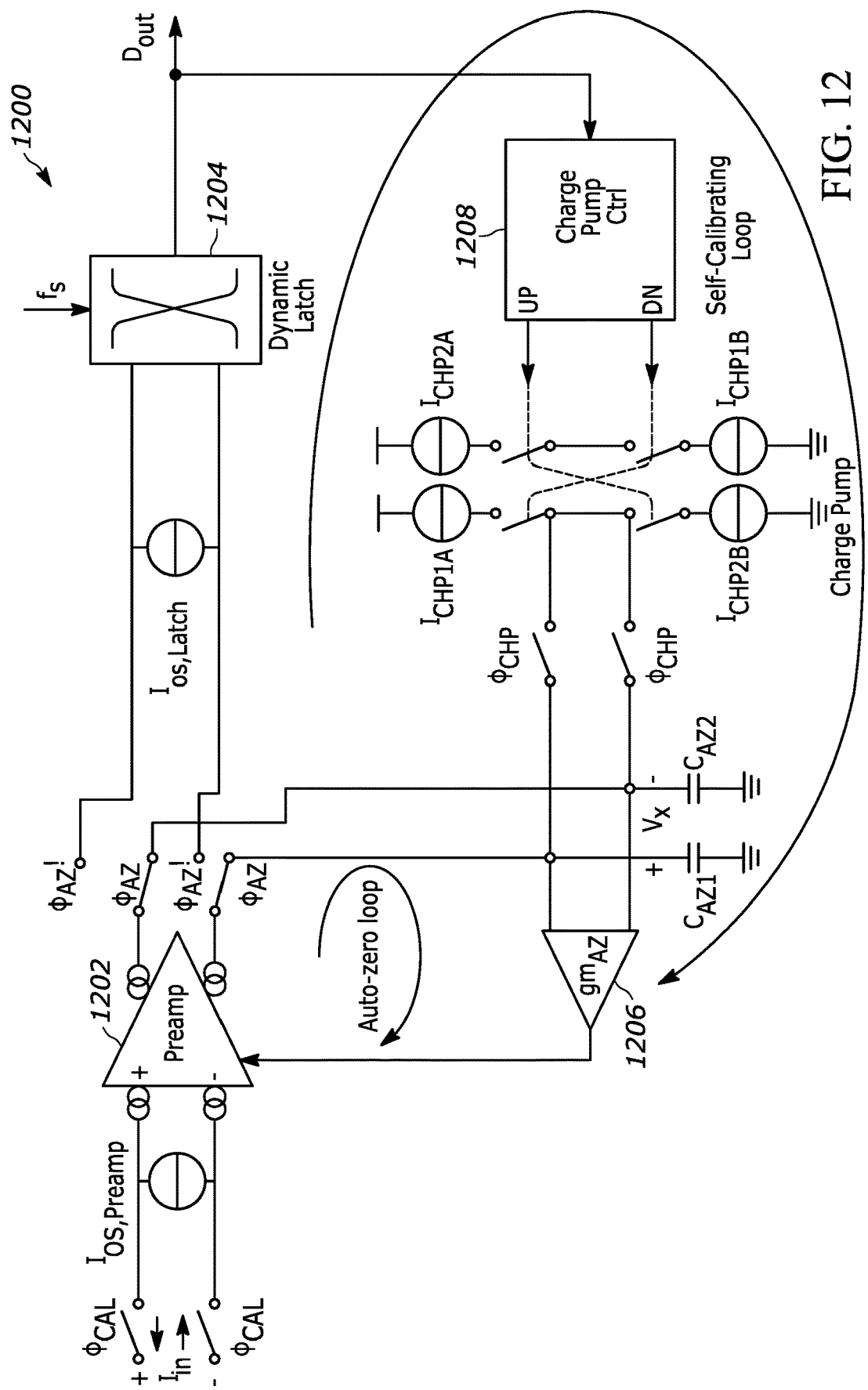
FIG. 12 is a schematic diagram of a two-step offset compensation current-domain comparator circuit.

FIG. 12 is a schematic diagram of a two-step offset compensation current-domain comparator circuit 1200. Two step offset calibration based on a first auto zeroing step of the preamplifier 1202 followed by an overall comparator self calibration loop using a charge pump to further modify the correction signal on the memory caps The benefit is that it compensates the offset of the overall comparator (preamplifier+latch) but allows shortening the overall calibration time for when very low residual offset is desired.

It does the above by first autozeroing the preamplifier's offset quickly at a speed determined by the pre-amplifier's bandwidth and hence not the charge pump current Then drives the remaining offset to a very low residual offset closing a self calibration loop around the comparator injecting a small correction current with the charge pump in a relatively short time (since most of the offset is already calibrated in the first step).

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. A comparator circuit comprising:
   a differential preamplifier including differential memory capacitors;
   a dynamic latch configured to latch an output of the differential preamplifier at a sampling frequency;
   an auto-zero loop including an auxiliary amplifier configured to inject a correction signal into the differential preamplifier based on a voltage across the differential memory capacitors;
   a self-calibrating circuit including a charge pump configured to adjust the voltage across the differential memory capacitors based on an output of the dynamic latch; and
   control logic configured to,
      during a first time period, send a first signal to enable the auto-zero loop to provide an initial offset calibration of the differential preamplifier,
      during a second time period occurring after the first time period, send a second signal to enable the self-calibrating circuit to provide an offset calibration of the differential preamplifier, minimize an offset of the dynamic latch, wherein the first time period has a duration based on a bandwidth of the differential preamplifier, wherein a duration of the first time period and second time period is equal to or less than a self-calibrating circuit only residual offset, and a residual offset of the comparator circuit is less than the self-calibrating circuit only residual offset.

2. The comparator circuit of claim 1, wherein the duration is less than or equal to a settle time of the self-calibrating only circuit that is expressed by $$T_{settle} = \frac{C_H \times V_{OS,preamp}}{I_{CHP}},$$

in which $C_H$ is an average capacitance of the differential memory capacitors, $V_{OS,preamp}$ is an initial input offset of the differential preamplifier, and $I_{CHP}$ is a current of the charge pump.

3. The comparator circuit of claim 1, wherein the duration is based on a settle time that is expressed by $$T_{settle,step1} \propto N \times C_{AZ} \times \left(\frac{1}{gmi}\right),$$

in which N is a number of time-constants that is between 1 and 100.

4. The comparator circuit of claim 3, wherein the number of time-constants that is between 1 and 10.

5. The comparator circuit of claim 1, wherein the initial offset calibration is based on a first correction value stored on the differential memory capacitors, and during the second time period, minimizing an offset due to the dynamic latch includes adding an additional correction value to the first correction value stored on the differential memory capacitors.

6. The comparator circuit of claim 1, wherein a residual offset of the comparator circuit after the second time period is disentangled from a calibration time of the circuit.

7. A method of controlling a comparator comprising:
   during a first time period, enabling an auto-zero loop to provide an initial offset calibration of a differential preamplifier that includes differential memory capacitors; and
   during a second time period after the first time period, enabling a self-calibrating circuit to provide an offset calibration of the differential preamplifier, and minimizing an output offset of a dynamic latch, wherein the first time period has a duration based on a bandwidth of the differential preamplifier, wherein a duration of the first time period and second time period is equal to or less than a self-calibrating circuit only residual offset, and a residual offset of the comparator circuit is less than the self-calibrating circuit only residual offset.

8. The method of claim 7, wherein the dynamic latch is configured to latch an output of the differential preamplifier at a sampling frequency, the auto-zero loop including an auxiliary amplifier configured to inject a correction signal into the differential preamplifier based on a voltage across the differential memory capacitors, and the self-calibrating circuit including a charge pump configured to adjust the voltage across the differential memory capacitors based on an output of the dynamic latch.

9. The method of claim 7, wherein the duration is less than or equal to a settle time of the self-calibrating only circuit that is expressed by $$T_{settle} = \frac{C_H \times V_{OS,preamp}}{I_{CHP}},$$

in which $C_H$ is an average capacitance of the differential memory capacitors, $V_{OS,preamp}$ is an initial input offset of the differential preamplifier, and $I_{CHP}$ is a current of the charge pump.

10. The method of claim 7, wherein the duration is based on a settle time that is expressed by $$T_{settle,step1} \propto N \times C_{AZ} \times \left(\frac{1}{gmi}\right),$$

in which N is a number of time-constants that is between 1 and 100.

11. The method of claim 10, wherein the number of time-constants is between 1 and 10.

12. A circuit comprising:
   a differential preamplifier including differential memory capacitors;
   a dynamic latch configured to latch an output of the differential preamplifier at a sampling frequency;
   an auto-zero loop including an auxiliary amplifier configured to inject a correction signal into the differential preamplifier based on a voltage across the differential memory capacitors, wherein the correction signal is injected in response to the auxiliary amplifier being disconnected from a signal path, and wherein auto-zero loop is opened in response to being settled to the correction signal level and the auxiliary amplifier is connected;

a self-calibrating circuit including a charge pump configured to adjust a current to the differential memory capacitors based on an output of the dynamic latch; and control logic configured to, during a first time period associated with autozeroing the differential preamplifier, send a first signal to enable the auto-zero loop to provide an initial offset calibration of the differential preamplifier, wherein the first time period has a duration based on a bandwidth of the differential preamplifier but not the current of the charge pump, during a second time period occurring after the first time period, send a second signal to enable the self-calibrating circuit to provide the offset calibration of the differential preamplifier, minimize an offset of the dynamic latch.

13. The circuit of claim 12, wherein the duration of the first time period is less than or equal to a settle time of the self-calibrating only circuit that is expressed by $$T_{settle} = \frac{C_H \times V_{OS,preamp}}{I_{CHP}},$$

in which $C_H$ is an average capacitance of the differential memory capacitors, $V_{OS,preamp}$ is an initial input offset of the differential preamplifier, and $I_{CHP}$ is a current of the charge pump.

14. The circuit of claim 12, wherein a duration of the first time period is based on a settle time that is expressed by $$T_{settle,step1} \propto N \times C_{AZ} \times \left(\frac{1}{gmi}\right),$$

in which N is a number of time-constants that is between 1 and 100.

15. The circuit of claim 12, wherein the initial offset calibration is based on a first correction value stored on the differential memory capacitors, and during the second time period, minimizing an offset due to the dynamic latch includes adding an additional correction value to the first correction value stored on the differential memory capacitors.

* * * * *